(12) United States Patent
Baldwin et al.

(10) Patent No.: US 8,014,826 B2
(45) Date of Patent: Sep. 6, 2011

(54) BASE STATION AND COMPONENT CONFIGURATION FOR VERSATILE INSTALLATION OPTIONS

(75) Inventors: John H. Baldwin, Morristown, NJ (US); James T. Butler, Rockaway, NJ (US); Peter Giannoglou, Towaco, NJ (US); Philip J. Hubbauer, North Caldwell, NJ (US)

(73) Assignee: Alcatel Lucent, Paris (FR)

( * ) Notice: Subject to any disclaimer, the term of this patent is extended or adjusted under 35 U.S.C. 154(b) by 1051 days.

(21) Appl. No.: 11/767,638

(22) Filed: Jun. 25, 2007

(65) Prior Publication Data
US 2008/0318631 A1   Dec. 25, 2008

(51) Int. Cl.
*H04M 1/00* (2006.01)
(52) U.S. Cl. ............ 455/561; 455/575.1; 455/90.3; 370/335; 361/685
(58) Field of Classification Search ............ 455/561, 455/562.1, 90, 560, 403, 90.3, 575.1; 361/685, 361/683, 687, 692, 724, 624; 211/26; 370/335
See application file for complete search history.

(56) References Cited

U.S. PATENT DOCUMENTS

| | | | | |
|---|---|---|---|---|
| 5,911,117 A | * | 6/1999 | Bhame et al. | 455/575.1 |
| 5,997,117 A | * | 12/1999 | Krietzman | 312/265.4 |
| 6,301,095 B1 | * | 10/2001 | Laughlin et al. | 361/624 |
| 7,149,546 B1 | * | 12/2006 | Hollen | 455/561 |
| 7,438,638 B2 | * | 10/2008 | Lewis et al. | 454/184 |
| 2004/0224754 A1 | * | 11/2004 | Bursill | 463/22 |
| 2004/0231875 A1 | * | 11/2004 | Rasmussen et al. | 174/50 |
| 2005/0089027 A1 | * | 4/2005 | Colton | 370/380 |
| 2005/0099766 A1 | * | 5/2005 | Fraley et al. | 361/685 |
| 2006/0084473 A1 | * | 4/2006 | Pollanen et al. | 455/561 |
| 2007/0177552 A1 | * | 8/2007 | Wu et al. | 370/335 |
| 2008/0212273 A1 | * | 9/2008 | Bechtolsheim | 361/685 |
| 2009/0178986 A1 | * | 7/2009 | Coglitore et al. | 211/26 |

\* cited by examiner

*Primary Examiner* — Tan Trinh
(74) *Attorney, Agent, or Firm* — Carlson, Gaskey & Olds PC (57) ABSTRACT

A wireless communication base station assembly includes at least one base band unit (40) having one primary circuit board (100) with circuitry for a control function (102), a timing function (104), a line interface function (106) and a radio interface function (108). The electronics and circuitry for each of these functions are all supported on the one primary circuit board (100). At least one channel module (e.g., a channel card) is coupled to the primary circuit board. A single, generally rectangular housing (42) contains the primary circuit board and the channel module. Disclosed examples include a rack (50) having a plurality of slots (52) configured to accommodate the housing (42).

16 Claims, 6 Drawing Sheets

BASE STATION AND COMPONENT CONFIGURATION FOR VERSATILE INSTALLATION OPTIONS

FIELD OF THE INVENTION

This invention generally relates to communication. More particularly, this invention relates to base station and component configurations.

DESCRIPTION OF THE RELATED ART

Figure 1:
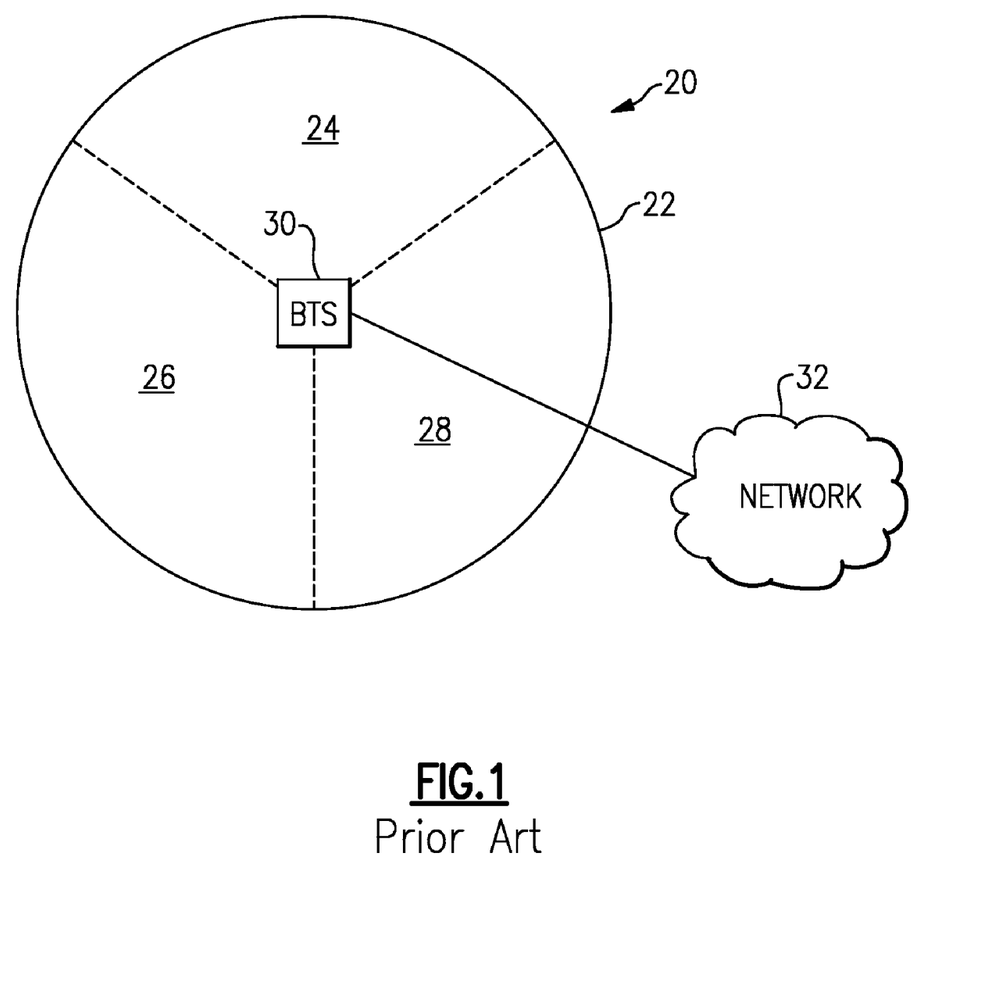
FIG. 1 schematically shows selected portions of a wireless communication system according to the prior art.

FIG. 1 schematically shows selected portions of a known wireless communication system 20. A cell 22 is a geographic area within which wireless communication coverage is provided. The cell 22 is divided into a plurality of sectors 24, 26 and 28. A base station transceiver (BTS) 30 includes known components used for supporting the wireless communication coverage in each of the sectors. The BTS 30 also communicates with a network 32 in a known manner.

While such arrangements are useful and have proven effective for many situations, those skilled in the art are always striving to make improvements. For example, typical base stations are relatively large and bulky such that they require a significant amount of space for installation. Typical systems are relatively expensive, heavy and dissipate a large amount of heat. Additionally, base stations are largely radio systems by nature and often possess special features to address such challenging issues as electromagnetic emissions and high frequency cabling. Typical base stations are deployed in relatively unique environments that require unique installation methods. Consequently, typical base stations require special treatment by specially trained personnel.

Such features of typical base stations limit the ability to deploy them in a variety of situations or locations. For example, private company premises are typically not considered suitable locations for a base station because of the high cost and complexity of deployment. Additionally, such a prospective customer is typically unfamiliar with the physical design of typical base station equipment.

It would be useful to have a cost-effective base station arrangement that can be more readily deployed in a manner similar to common commercial hardware.

SUMMARY

An exemplary wireless communication base station assembly includes a base band unit having one primary circuit board with circuitry for a channel function, a timing function, a line interface function and a radio interface function all supported on the one primary circuit board. At least one channel module is coupled to the primary circuit board. A single, generally rectangular housing contains the one primary circuit board, and the channel module.

One example assembly includes a rack having a plurality of generally rectangular slots that have dimensions corresponding to the dimensions of the housing of the base band unit.

The various features and advantages of the disclosed examples will become apparent to those skilled in the art from the following detailed description. The drawings that accompany the detailed description can be briefly described as follows.

DETAILED DESCRIPTION

Disclosed examples provide a cost-effective base station product that is configured to be more easily deployed in a variety of circumstances. In some examples, the base station components feature mainstream wireless infrastructure hardware and features but are configured to resemble common commercial hardware such as data networking hardware, IP routers or Ethernet routers. The example configurations allow for adapting the existing high technology typically associated with larger, traditional base stations but puts them into a physical form factor that is optimized for common commercial environments and installation practices. With the disclosed examples, it becomes easier to introduce wireless communication base station technology to a wider variety of customers and in a wider variety of situations while still providing the type of service available from existing base station configurations.

Figure 2A:
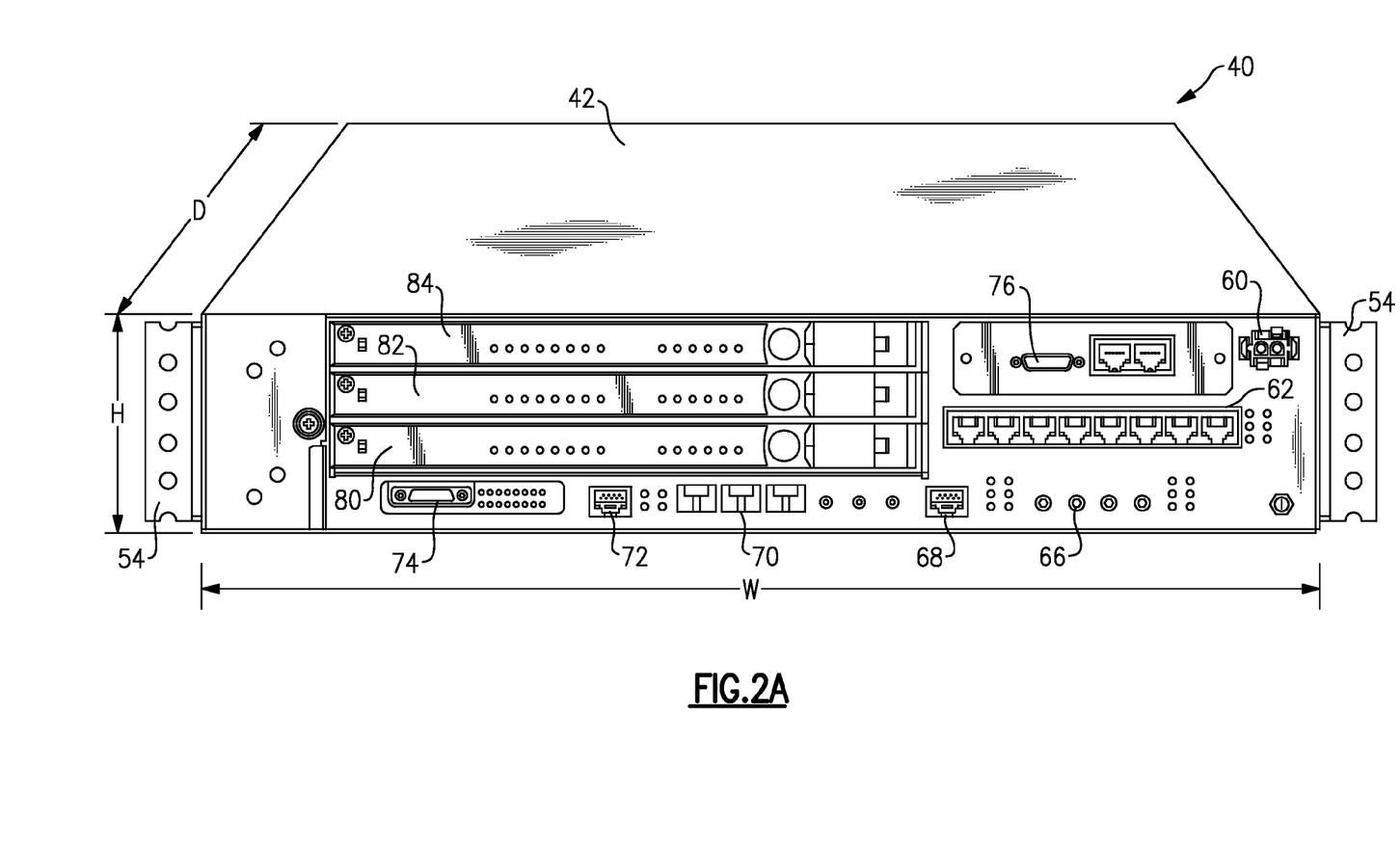
FIG. 2A illustrates an example base station assembly component.
Figure 2B:
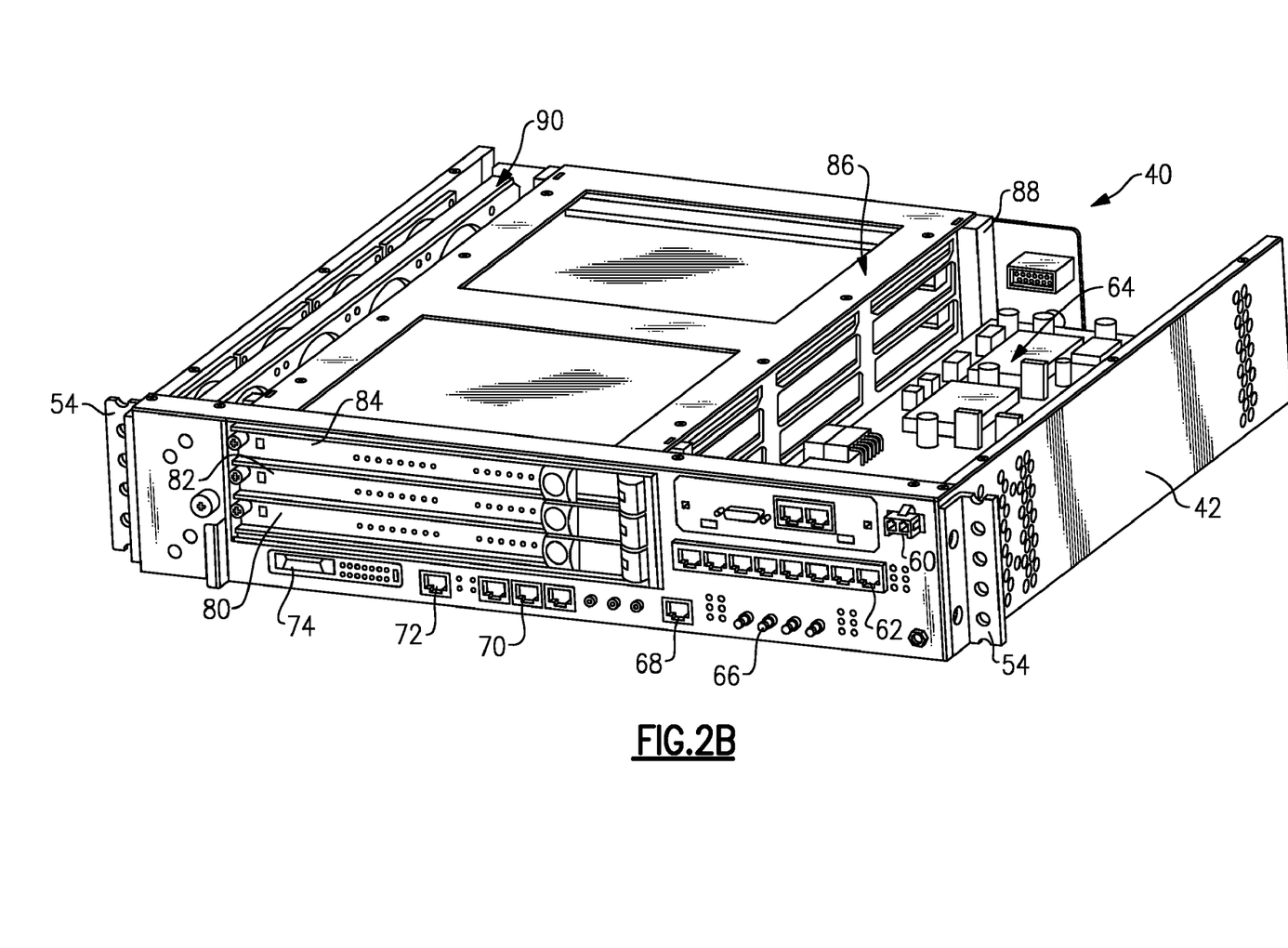
FIG. 2B illustrates the example of FIG. 2A with selected portions of a housing removed.
Figure 3:
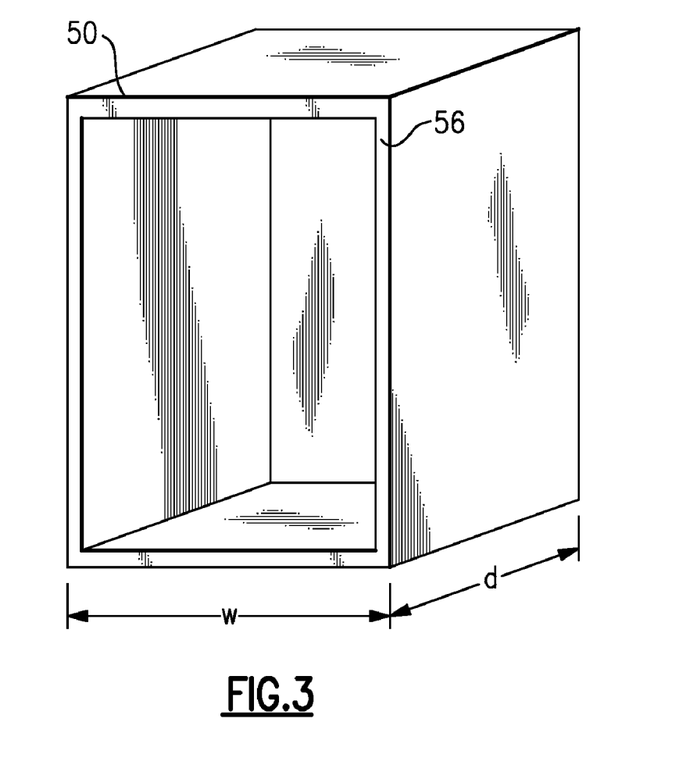
FIG. 3 illustrates an example rack.

Referring to FIGS. 2A, 2B and 3, example portions of an example base station assembly are shown. FIGS. 2A and 2B show a base station component 40, which is a base band unit in this example. The base band unit (BBU) 40 has a single, generally rectangular housing 42 within which all of the operative components of the base band unit are contained. In this example, the housing 42 has a height H, width W and depth D. The dimensions of H, W and D are selected so that the BBU 40 can be readily installed in a wide variety of situations. In some instances, the dimensions are selected to be similar to those associated with commercial hardware devices that are used outside of the wireless communication industry (e.g., data network routers) so that the BBU 40 can be installed at the same location as such devices, which allows the BBU 40 to be more readily integrated into an inside of a building, for example).

In some examples, the industry standard unit size U is used as a basis for the height H of the housing 42. In one example, H is 2U or 3U. The width W and depth D can be selected to correspond to the dimensions of a rack intended to support the housing. In one example, the height H is less than half the width W and less than half the depth D. In one example, the width W and depth D are each about four times larger than the height H. For example, the height H of one BBU 40 is approximately 100 mm, the depth D is about 400 mm and the width W is about 480 mm. Such dimensions allow for a BBU 40 to be employed alongside or in the same general location as commercial hardware used as IT/Ethernet routers.

As shown in FIG. 3, an example base station assembly includes a rack 50 that is configured to support a base station component such as the example BBU 40 of FIGS. 2A and 2B. In this example, the rack 50 has a width w and a depth d. The dimensions of w and d are selected to correspond to the dimensions of W and D of the base station component intended to be supported within the rack 50. In the illustrated example, the BBU 40 includes mounting brackets 54 that can be secured to a mounting surface 56 on the rack 50 to maintain a secure placement of the BBU 40 within the rack 50.

One of the features of the example BBU 40 is that it integrates and consolidates all base band functions into a single base band unit that is small, lightweight, capable of being physically mounted into a variety of commonly used equipment racks and is capable of operating in a typical commercial environment because of the amount of power and electromagnetic emissions associated with the example configuration, for example.

When installed in the rack 50, the front face (according to the illustration) of the housing 42 provides access to a variety of features of the BBU 40. For example, a power connection 60 allows for coupling the BBU 40 to an appropriate power source (e.g., a DC power source). A plurality of input and output ports 62 are useful for making connections with other devices using, for example, T1, E1, RMT and LIU type connections. The input and output ports are associated with appropriate electronics supported on an input/output and power board 64 supported within the housing 42.

The illustrated example includes a plurality of clock and timing ports 66, an optical communications port 68, a plurality of common public radio interface (CPRI) link portions 70, a testing or maintenance port 72 and internal T1/E1 connections 74 and 76. Given this description, those skilled in the art will realize how such connection ports can be used to meet the needs of their particular situation. Additionally, it should be noted that the example types of ports or connections mentioned in this description are not limiting. One feature of the disclosed example is that it can be readily configured for a variety of types of connections or communications with the BBU 40 so that the basic configuration of the illustrated example can be customized to accommodate a variety of requirements for particular installations.

Another feature of the illustrated example, which facilitates customizing a BBU 40 for a particular configuration includes plug in slots 80, 82 and 84. These slots allow for installing pre-configured technology cards such that they are supported by appropriate structure 86 within the housing 42 and make a connection with an interconnect board 88 once the cards are installed. This configuration allows for customizing the operation of the BBU 40 in various ways. For example, in a UMTS (or W-CDMA) installation, the three slots 80, 82 and 84 can each support a channel card. In a CDMA installation, two of the slots may be used for each supporting a channel card while a third one of the slots can support a controller card or a combined channel and controller card. Another example BBU 40 is configured to support Wi-MAX communications.

The illustrated example includes a fan cartridge 90 that is very compact and lightweight. The reduced size and strategic packaging of the internal components of the BBU 40 allows for a smaller fan assembly to be used compared to previous base station designs. There is less heat dissipation required and, therefore, a smaller, quieter and less expensive fan assembly 90 can be used. One feature of such a fan assembly is that it uses less power, which makes the BBU 40 even more economical. Another feature of the example fan assembly is that it is accessible from the front of the housing 42 and has a blind plug-in connection feature in the rear.

Figure 4:
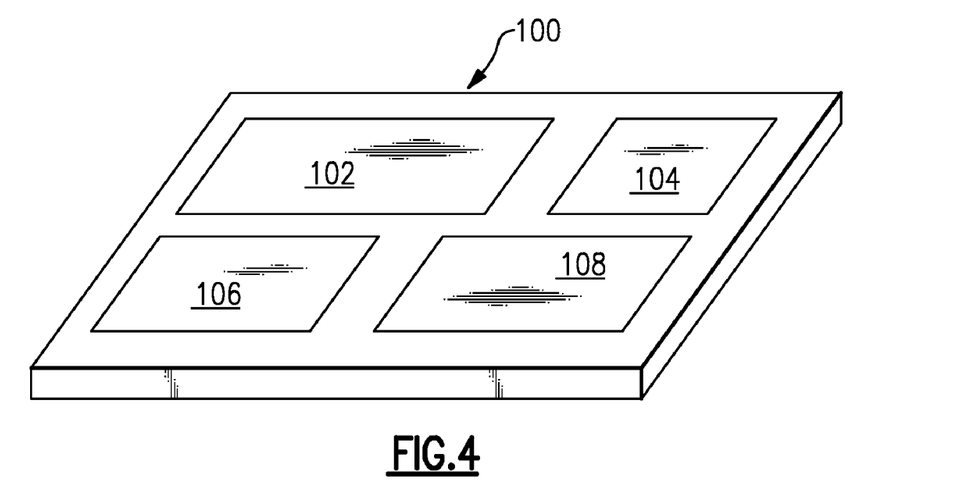
FIG. 4 schematically illustrates a circuit board.

Another feature of the example BBU 40 is schematically shown in FIG. 4. A single, primary circuit board 100 supports the circuitry and components used for performing a plurality of base band functions all on a single printed circuit board. For example, a portion 102 includes the circuitry and electronics for a control function of the BBU 40, a portion 104 includes the circuitry and electronics for a timing function of the BBU 40, a portion 106 includes the circuitry and electronics for a line interface (e.g., backhaul) function of the BBU 40 and a portion 108 includes the circuitry and electronics for supporting a radio interface function of the BBU 40. By integrating all of these functions onto a single primary circuit board 100, the illustrated example is able to be configured in the smaller size and convenient packaging configuration as shown in the drawings. In previous base station arrangements, each of these functions were typically supported on their own individual circuit board and in many cases represented a separate component with its own housing, connections and space requirements. With the illustrated example, the BBU 40 can be more readily deployed in a variety of configurations and a variety of situations.

Figure 5:
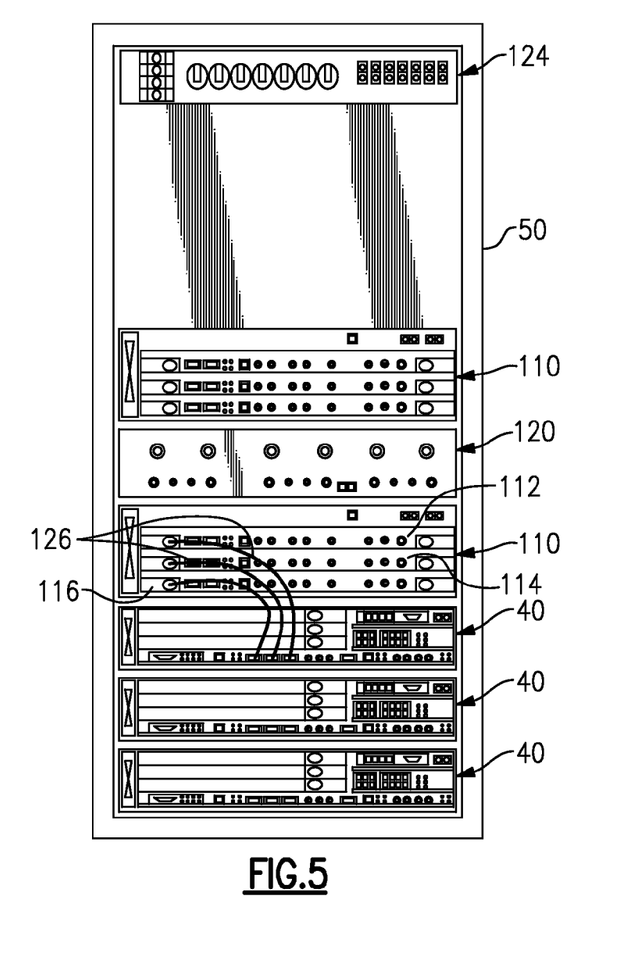
FIG. 5 illustrates an example base station assembly having a plurality of components supported within a rack.

FIG. 5 shows an example base station assembly where a single rack 50 supports a plurality of BBUs 40. The example of FIG. 5 also includes a plurality of radio frequency modules 110 each supported within a corresponding portion of the rack 50. Each of the radio frequency modules 110 has at least one radio for supporting at least one wireless communication sector. In the illustrated example, the radio frequency modules 110 each include the capability of supporting three sectors by including three radio portions 112, 114 and 116. Each of the radio frequency modules 110 includes a generally rectangular housing similar to that used for the BBU 40. In some examples, the dimensions of the radio frequency module housings will be identical to those of the BBUs. In other examples, the height of a radio frequency module may be different than the height H of the BBUs. The width and depth of the radio frequency module housing preferably is the same as that of the BBUs to facilitate convenient installation of a desired number of BBUs and radio frequency modules within a single rack 50.

In the illustrated example, each radio frequency module 110 includes circuitry, software, electronics or a combination of them to support digital signal processing, radio (analog) signal processing, a transmitter amplifier and a receiver amplifier with antenna diagnostics capabilities. A CPRI connection is used to couple the radio frequency module 110 with a BBU 40 in one example.

The example of FIG. 5 also includes a radio frequency filter panel 120. In this example, the radio frequency filter panel 120 is supported in a housing that has dimensions corresponding to the rack 50. Another component of the example of FIG. 5 is a power distribution panel 124. The components of the power distribution panel 124 are arranged so that the entire panel fits within a corresponding portion of the rack 50.

As shown in FIG. 5, the rack 50 includes a plurality of still unused space. This allows for further customization of the base station assembly by later adding additional BBUs, additional radio frequency modules or incorporating other types of components within the rack 50.

With the illustrated arrangement, it is relatively simple to make appropriate connections between a BBU 40 and a corresponding radio frequency module 110 or a plurality of modules as may be needed. In one example, the CPRI ports 70 are used for making a connection 126 between each sector supported by a radio frequency module 110 and the BBU 40. The illustrated arrangement allows for significant flexibility to address a variety of application needs. For example, the radio frequency modules may each be different to provide different types of wireless communication coverage within a desired area. Radio frequency power levels may vary from very low signal levels (e.g., for highly localized coverage) to fairly high signal levels (e.g., for macrocellular coverage or for driving an in-building passive antenna distribution system). In some examples, the BBU 40 includes dynamic coding to allow a variety of other interfaces to the radio frequency modules besides a CPRI connection.

While the radio functions in the example of FIG. 5 are separated from the BBUs 40, it is possible to incorporate a radio card into one of the slots 80, 82 or 84 to allow the radio frequency portion of a base station assembly to be located within the housing 42 of a BBU 40. With such an example, the entire BTS is contained within a single housing 42 capable of producing radio frequency outputs for direct transmission over an RF antenna system or for distribution into an antenna distribution system such as those that may be found wired within buildings, on campuses, within commercial centers (e.g., shopping malls) and other places where high wireless traffic and usage rates are expected.

In one example, a BBU 40 is useful with a traditional network architecture that includes high capacity elements such as a radio network controller and a public switched telephone network or a packet data network. In one example, a BBU 40 supports a base station router network architecture that eliminates the need for such costly network elements as the radio network controller and the base station router architecture allows for a connection directly from the BBU 40 into a public data network. Such so-called flat architecture arrangements can be realized using a BBU 40 or by configuring another component to perform RNC, SGSN and GGSN functions into a box configured similar to the housing 42 of the BBU 40 such that those functions can also be supported within the rack 50. In one example, base station router capabilities are added by incorporating additional software within the housing 42 of the BBU 40.

Figure 6:
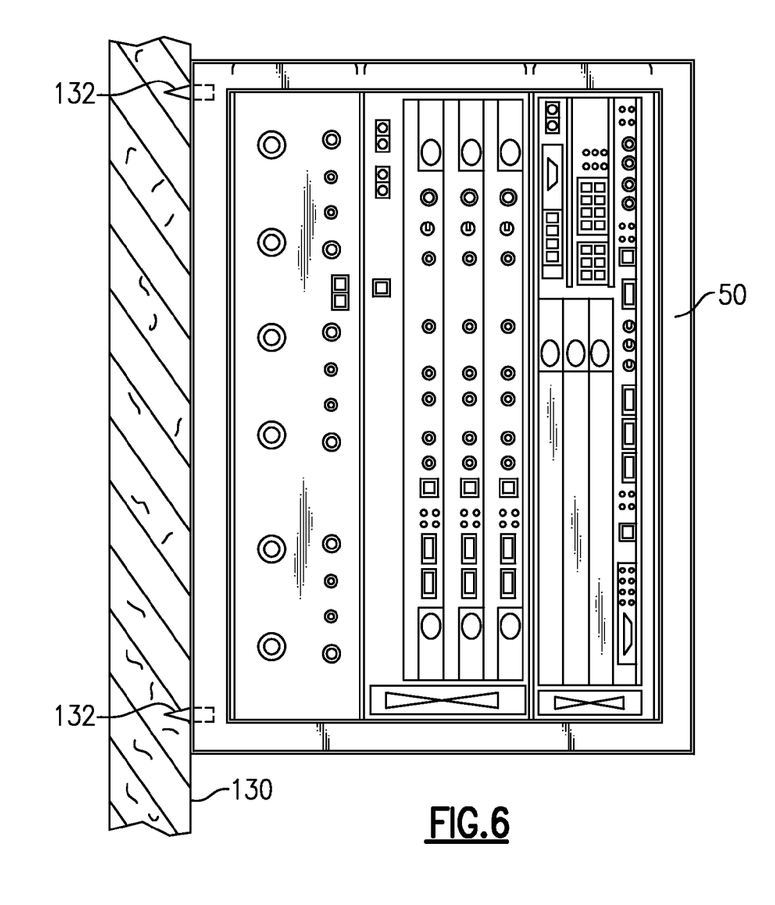
FIG. 6 illustrates another example base station assembly.

Another example arrangement is shown in FIG. 6. In this example, the rack 50 is configured to be mounted onto a wall 130 using appropriate anchors 132. By hanging the rack 50 on a wall as schematically shown in FIG. 6, an entire base station assembly can be conveniently supported within a relatively small area within a building, for example, or on the exterior of a building. The strategic consolidation of functions onto a single primary circuit board and the ability to customize how a BBU 40 operates (e.g., UMTS, CDMA or WiMax) allows for a strategic deployment of a variety of base stations in a variety of circumstances.

Figure 7:
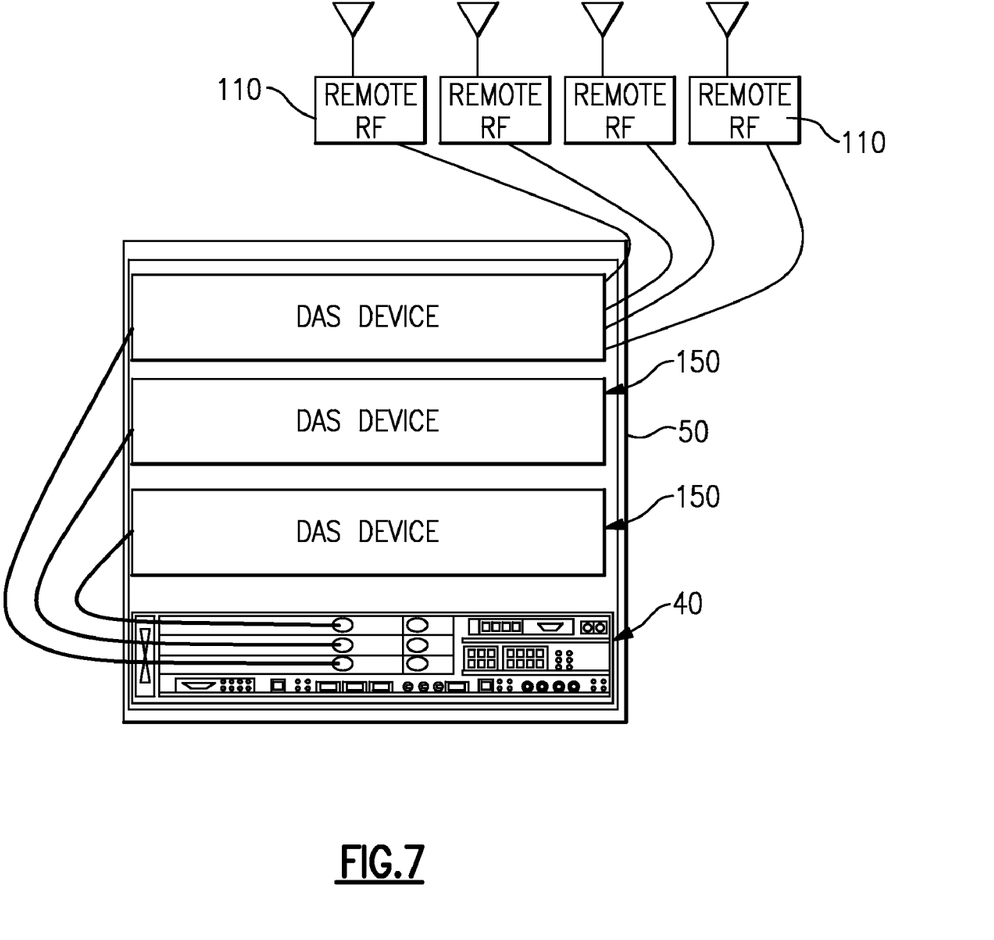
FIG. 7 illustrates another example base station assembly.

FIG. 7 shows another example arrangement where a rack 50 supports a BBU 40 and a plurality of distribution and antenna systems (DAS) devices 150. In this example, each DAS device 150 is coupled with remotely located radio frequency modules 110 that are positioned strategically within a building, along a campus or a selected region. In this example, the radio frequency modules 110 may have a physical configuration similar to that used in the example of FIG. 5 or may be configured differently because they need not be supported in the rack 50 so they do not need to have a configuration similar to the housing 42 of a BBU 40. On the other hand, such a configuration may prove convenient and useful depending on the particular location for any one of the radio frequency modules 110.

As can be appreciated from the preceding description, the example base station assemblies and components allow for a wider variety of applications for wireless base station capacity to meet varying needs. Additionally, a larger scope of potential customers can more readily integrate wireless base station functions for enhancing wireless communication coverage in a variety of commercial settings without the limitations associated with traditional, bulky and expensive base station arrangements.

The preceding description is exemplary rather than limiting in nature. Variations and modifications to the disclosed examples may become apparent to those skilled in the art that do not necessarily depart from the essence of this invention. The scope of legal protection given to this invention can only be determined by studying the following claims.

We claim:

1. A wireless communication base station assembly, comprising:
    a base band unit having
        one primary circuit board with circuitry for a control function, a timing function, a line interface function and a radio interface function all supported on the one primary circuit board;
        at least one channel module coupled to the one primary circuit board; and
        a single, generally rectangular housing containing the one primary circuit board and the channel module.

2. The assembly of claim 1, wherein the housing has a width, height and depth, the height being less than half the width and the depth being more than twice the height.

3. The assembly of claim 2, wherein the width and the depth are each about four times larger than the height.

4. The assembly of claim 2, wherein the height is about 100 mm, the depth is about 400 mm and the width is about 480 mm.

5. The assembly of claim 2, comprising
    a rack having a plurality of generally rectangular openings having a width and depth corresponding to the width and depth of the housing.

6. The assembly of claim 5, wherein the rack supports a plurality of the housings.

7. The assembly of claim 5, comprising
    a radio frequency module having at least one radio for supporting at least one wireless communication sector, the radio frequency module having a generally rectangular housing having a width and depth corresponding to the width and depth of the rack, the radio frequency module housing being supported in the rack.

8. The assembly of claim 7, wherein the radio frequency module comprises a plurality of radios for supporting a corresponding plurality of wireless communication sectors.

9. The assembly of claim 7, comprising
    a plurality of the radio frequency modules each supported in a corresponding portion of the rack.

10. The assembly of claim 5, comprising
    at least one radio frequency filter panel having a housing with dimensions corresponding to the width and depth such that the radio frequency filter panel is supported in the rack; and
    a power distribution panel having a housing with dimensions corresponding to the width and depth such that the power distribution panel is supported in the rack.

11. The assembly of claim 5, comprising
    at least one distribution and antenna system unit having a housing with dimensions corresponding to the width and depth such that the distribution and antenna system unit is received in the rack.

12. The assembly of claim 1, comprising:
    a rack having width and depth dimensions that correspond to the width and depth of the housing such that the base band unit is received in the rack; and at least one of
i) a radio frequency unit having at least one radio for supporting at least one wireless communication sector, or
ii) a distribution and antenna system unit, the at least one of the radio frequency unit or the distribution and antenna system unit having a rectangular housing with dimensions that correspond to the width and depth of the rack such that the at least one of the units is received in the rack.

13. The assembly of claim 12, comprising
a plurality of the base band units each received in a respective portion of the rack; and
a plurality of the radio frequency units each received in a respective portion of the rack.

14. The assembly of claim 12, comprising
a plurality of the distribution and antenna system units each received in a respective portion of the rack.

15. The assembly of claim 12, wherein the baseband unit and the at least one of the radio frequency unit or the distribution and antenna system unit has the same height, width and depth.

16. The assembly of claim 12, wherein the distribution and antenna system unit is supported in the rack and the radio frequency unit is located remotely from the rack.

* * * * *